United States Patent
Scharf et al.

(10) Patent No.: US 11,862,600 B2
(45) Date of Patent: Jan. 2, 2024

(54) METHOD OF FORMING A CHIP PACKAGE AND CHIP PACKAGE

(71) Applicant: Infineon Technologies AG, Neubiberg (DE)

(72) Inventors: Thorsten Scharf, Lappersdorf (DE); Alexander Heinrich, Bad Abbach (DE); Steffen Jordan, Pielenhofen (DE)

(73) Assignee: Infineon Technologies AG, Neubiberg (DE)

( * ) Notice: Subject to any disclaimer, the term of this patent is extended or adjusted under 35 U.S.C. 154(b) by 173 days.

(21) Appl. No.: 17/491,647

(22) Filed: Oct. 1, 2021

(65) Prior Publication Data
US 2022/0108974 A1   Apr. 7, 2022

(30) Foreign Application Priority Data
Oct. 2, 2020 (DE) .......................... 102020125813.5

(51) Int. Cl.
*H01L 23/48*   (2006.01)
*H01L 23/52*   (2006.01)
(Continued)

(52) U.S. Cl.
CPC ............ *H01L 24/80* (2013.01); *H01L 21/565* (2013.01); *H01L 23/4985* (2013.01);
(Continued)

(58) Field of Classification Search
CPC ... H01L 24/80; H01L 21/565; H01L 23/4985; H01L 2224/80357; H01L 2224/83385; H01L 2924/1511; H01L 2924/15724; H01L 2924/15738; H01L 2924/15311; H01L 2924/14; H01L 25/0657; H01L 2224/12105; H01L 2224/04105; H01L 2224/73204; H01L 24/32; H01L 2225/1058; H01L 29/66969; H01L 2224/16227; H01L 21/56; H01L 2224/73265; H01L 24/05; H01L 21/486; H01L 23/3114; H01L 2224/94;
(Continued)

(56) References Cited

U.S. PATENT DOCUMENTS 6,441,476 B1 * 8/2002 Emoto ................ H01L 23/3121
257/E23.125
2004/0115920 A1 * 6/2004 Yamazaki ........... H01L 23/4985
257/E21.705
(Continued)

FOREIGN PATENT DOCUMENTS

| DE | 10343053 A1 | 4/2005 |
|----|-------------|--------|
| DE | 102006036728 A1 | 2/2008 |
| DE | 102011000751 B4 | 7/2016 |

*Primary Examiner* — Niki H Nguyen
(74) *Attorney, Agent, or Firm* — Murphy, Bilak & Homiller, PLLC

(57) ABSTRACT

A method of forming a chip package is provided. The method includes providing a malleable carrier with a layer of an electrically conductive material formed thereon, and positive fitting the malleable carrier to a chip to at least partially enclose the chip with the malleable carrier. The layer at least partially physically contacts the chip, such that the layer electrically contacts a chip contact of the chip. The layer forms a redistribution layer.

22 Claims, 12 Drawing Sheets

(51) Int. Cl.
*H01L 29/40* (2006.01)
*H01L 23/00* (2006.01)
*H01L 21/56* (2006.01)
*H01L 23/498* (2006.01)

(52) U.S. Cl.
CPC ............. *H01L 2224/80357* (2013.01); *H01L 2224/83385* (2013.01); *H01L 2924/1511* (2013.01); *H01L 2924/15724* (2013.01); *H01L 2924/15738* (2013.01)

(58) Field of Classification Search
CPC ... H01L 2225/1035; H01L 2225/06541; H01L 25/0652; H01L 2225/0651; H01L 21/4853; H01L 24/82; H01L 23/5226; H01L 23/5383; H01L 2224/83; H01L 2224/11; H01L 2224/73253; H01L 2224/08145; H01L 2225/06548; H01L 2224/24137; H01L 2224/19; H01L 24/14; H01L 23/49833; H01L 23/12; H01L 2224/16; H01L 2224/48145; H01L 21/304; H01L 21/02631; H01L 2924/15331; H01L 24/75; H01L 33/0093; H01L 24/10; H01L 21/8221; H01L 21/84; H01L 2224/13009; H01L 25/072; H01L 2924/15313; H01L 23/3142; H01L 23/53295; H01L 24/12; H01L 2224/023; H01L 2224/06131; H01L 2224/08235; H01L 2224/73207

See application file for complete search history.

(56) References Cited

U.S. PATENT DOCUMENTS

| | | |
|---|---|---|
| 2005/0127503 A1 | 6/2005 | Gobl et al. |
| 2010/0148335 A1* | 6/2010 | Mikami ............ H01L 23/5387 257/E23.141 |
| 2013/0264684 A1 | 10/2013 | Yu et al. |
| 2014/0225222 A1 | 8/2014 | Yu et al. |
| 2014/0262475 A1 | 9/2014 | Liu et al. |
| 2019/0333811 A1 | 10/2019 | Wu et al. |

* cited by examiner

AND/OR

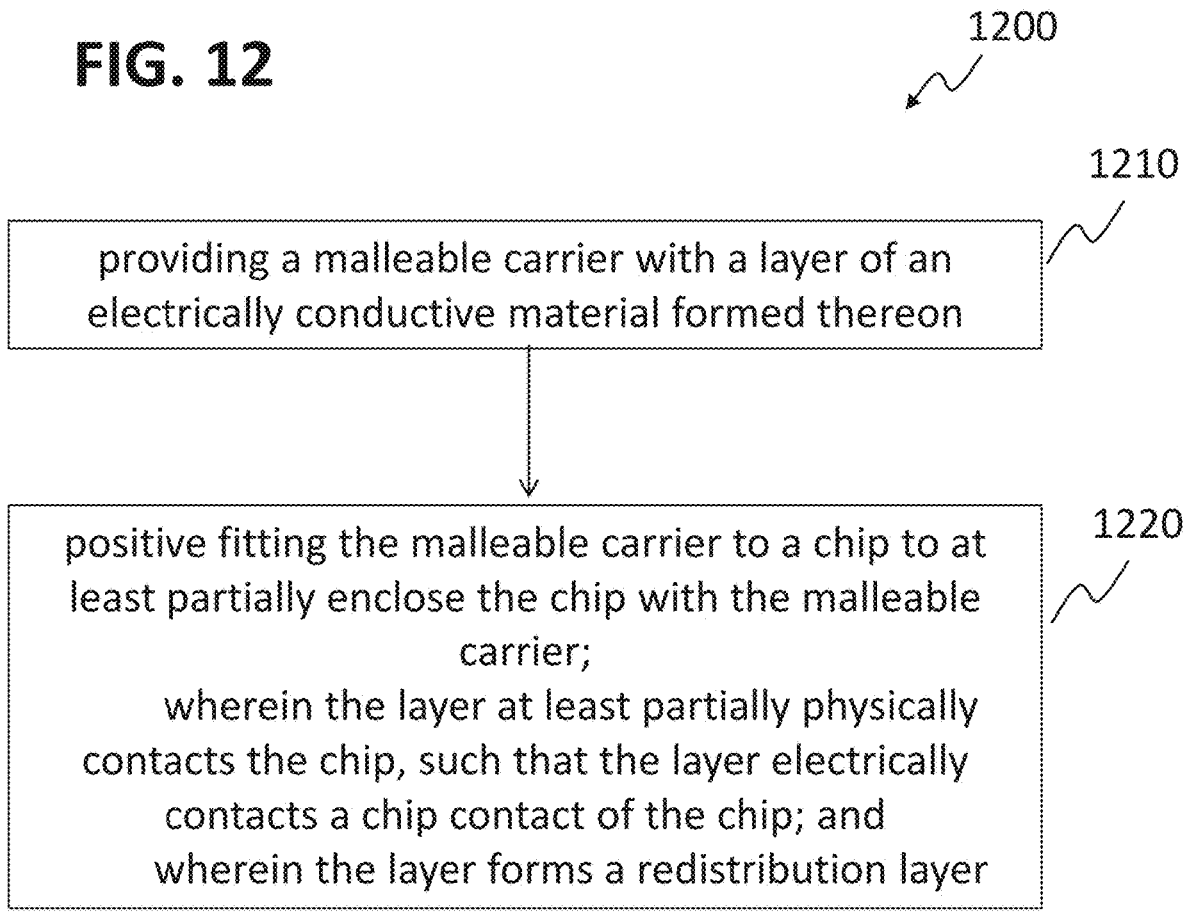

METHOD OF FORMING A CHIP PACKAGE AND CHIP PACKAGE

TECHNICAL FIELD

Various embodiments relate generally to a method of forming a chip package and to a chip package.

BACKGROUND

Packaging of a semiconductor chip may be expensive, as it may require a set of serial processes that may take quite a long time. One such process may be wire bonding, which may also be the process to prevent bigger substrates and therefore cost down by substrate area like in panel processes (MPPL).

Another challenge may be a hetero-integration of power products with logic and drivers: many assembly methods may be unable to provide fine structures required by the logic, and at the same time thick lines, e.g. copper lines, required for the power chip.

Usually, semiconductor chips may be bonded to a leadframe, and afterwards they may be wire bonded and molded. This—in particular the leadframe and a serial process for the wire bonding—may involve high material cost. Additionally, each package platform may require dedicated equipment and material. For panel solutions like the MPPL, thermosonic wire bonding may be impossible, since the required temperatures cannot be applied on the big areas provided there without severe oxidation problems. Other methods like chip embedding may still require serial processes like laser drilling.

SUMMARY

A method of forming a chip package is provided. The method may include providing a malleable carrier with a layer of an electrically conductive material formed thereon, and positive fitting the malleable carrier to a chip to at least partially enclose the chip with the malleable carrier, wherein the layer at least partially physically contacts the chip, such that the layer electrically contacts a chip contact of the chip, and wherein the layer forms a redistribution layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

Figure 4:
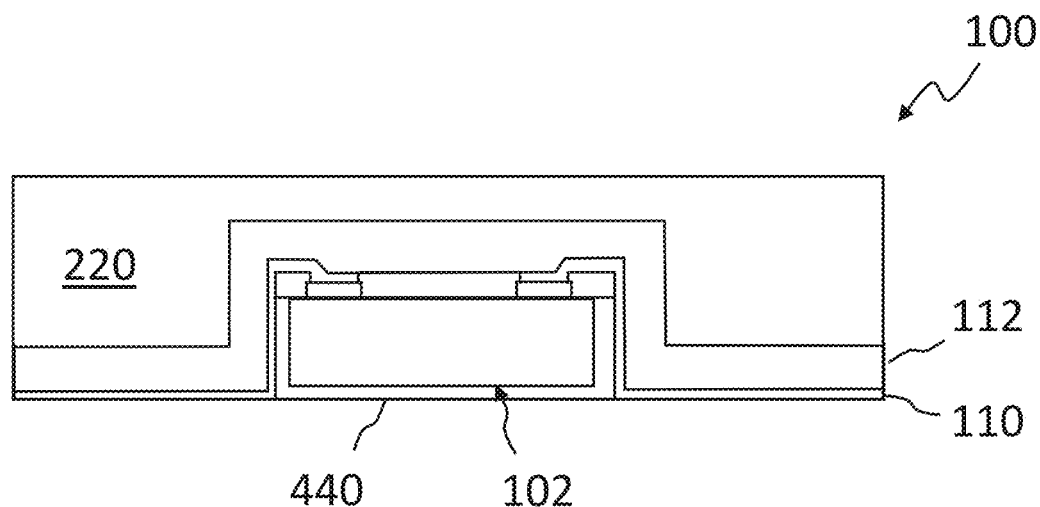
Figure 5:
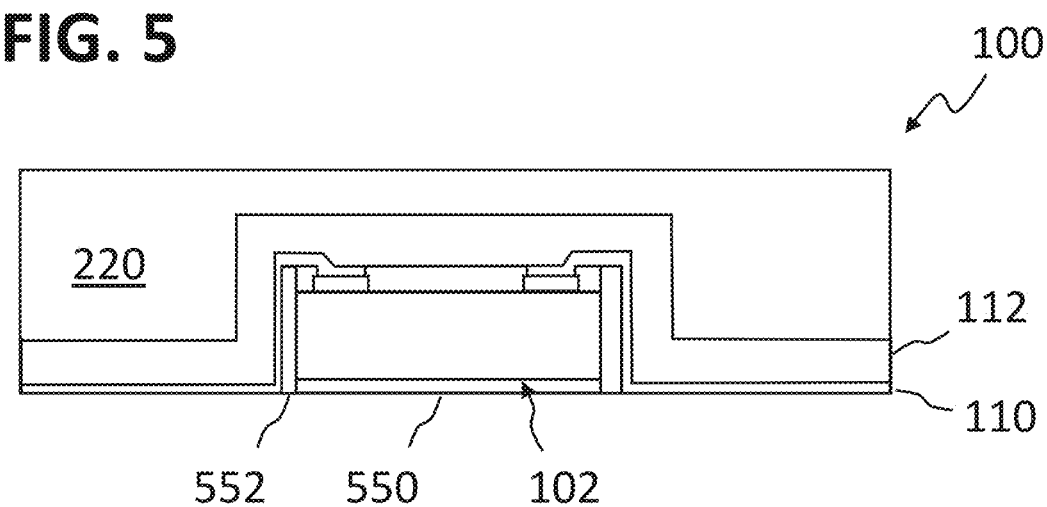
Figure 6:
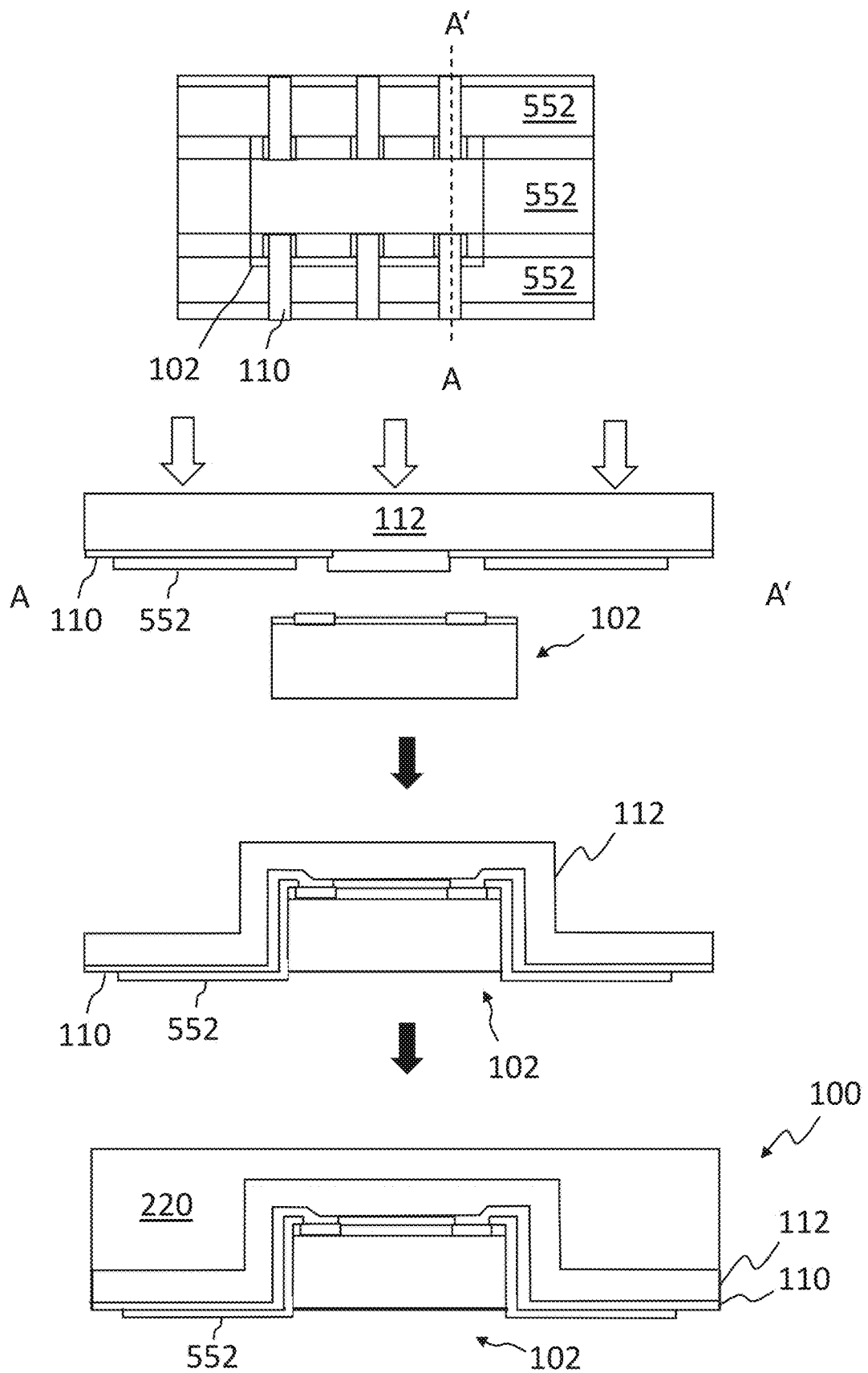
Figure 7:
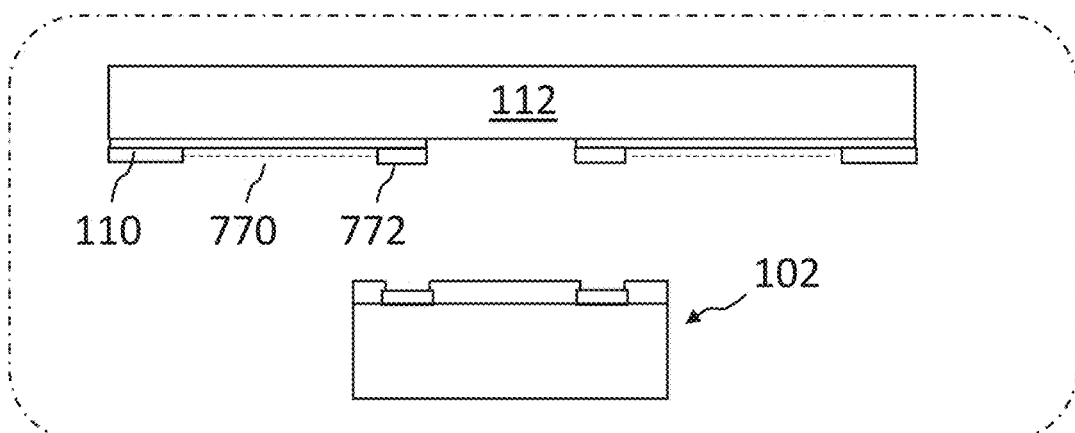
Figure 7:
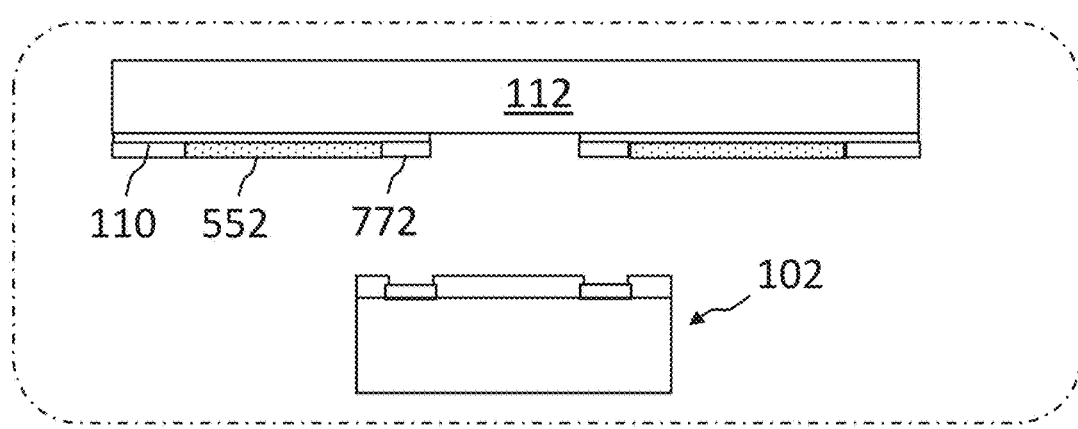
Figure 7:
Figure 7:
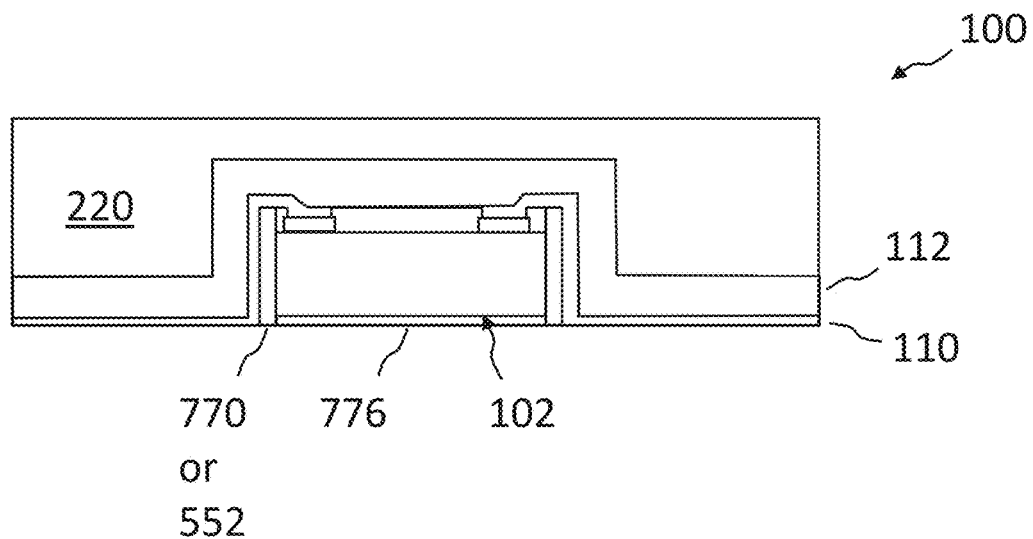
Figure 8:
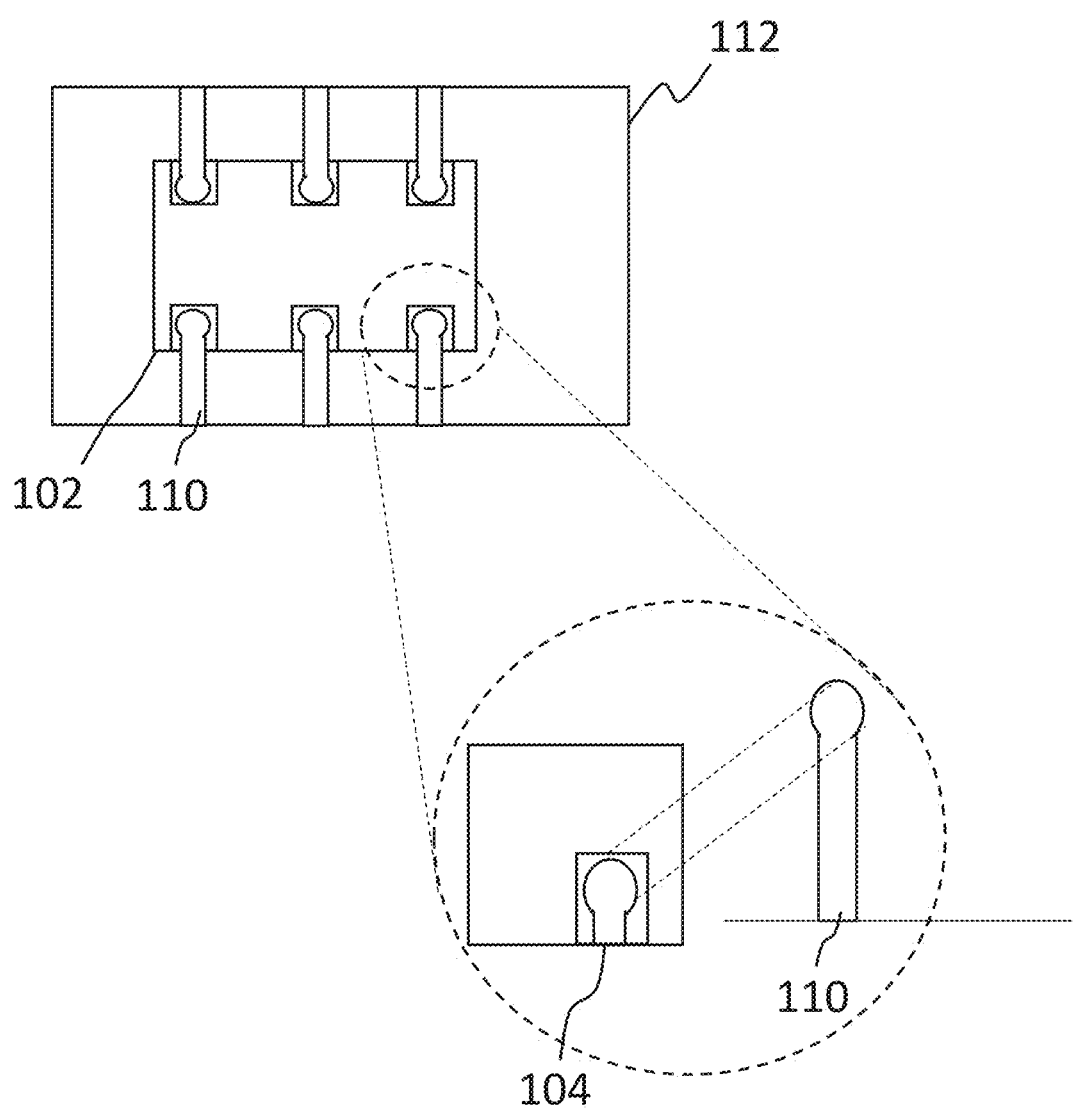
Figure 9A:
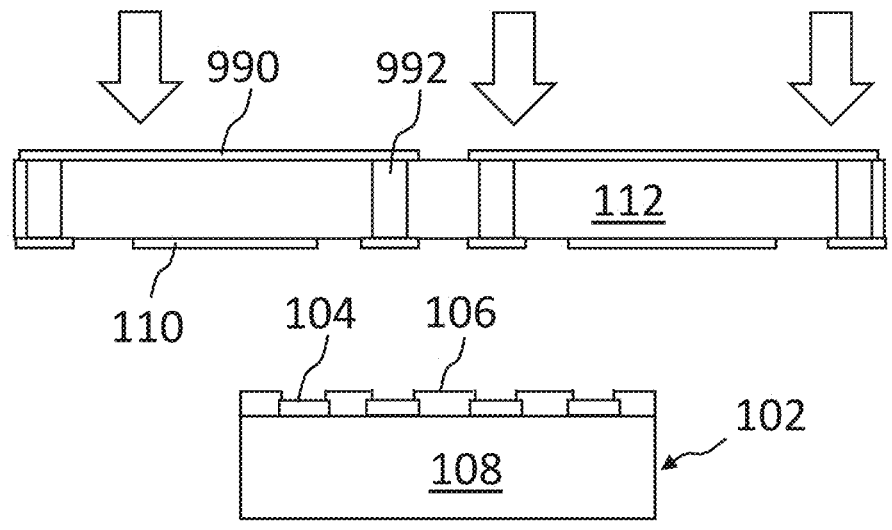
Figure 9A:
Figure 9A:
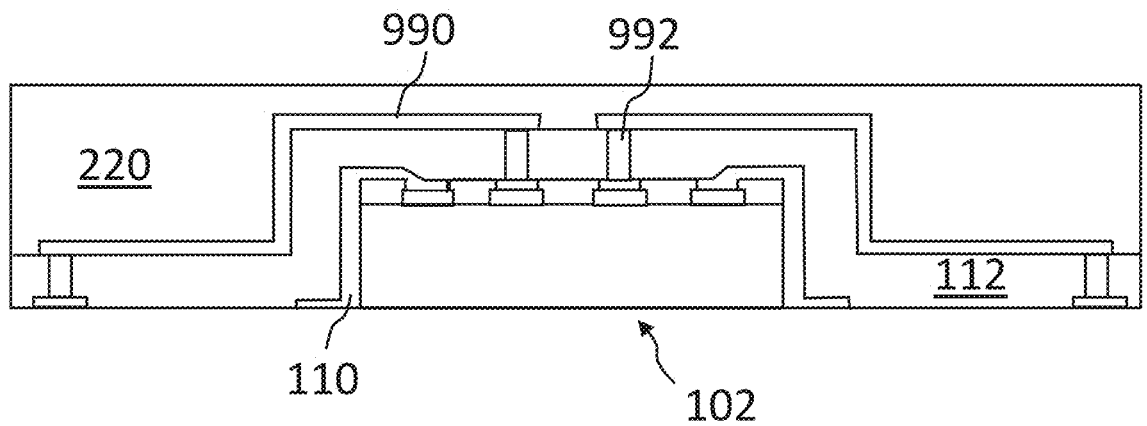
Figure 9B:
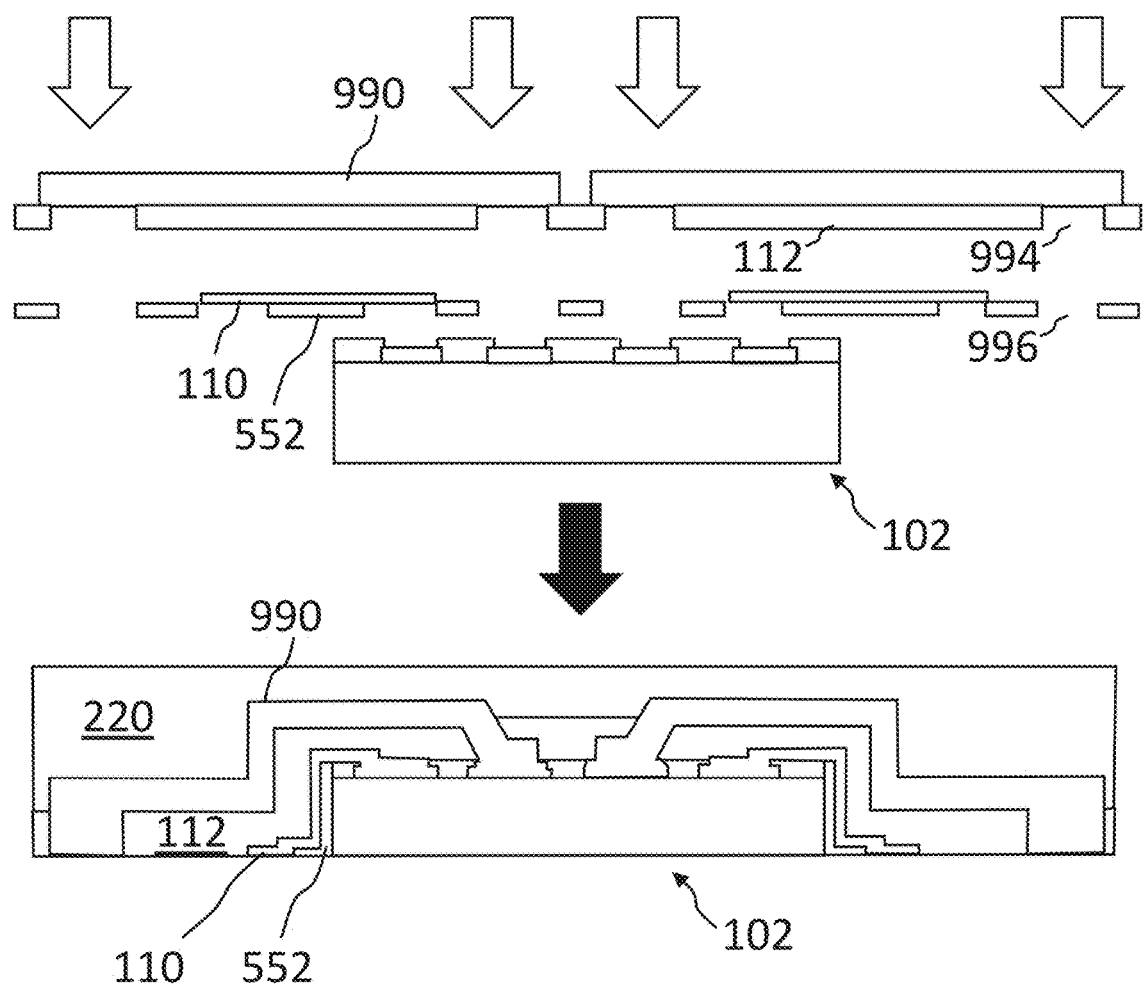
Figure 10A:
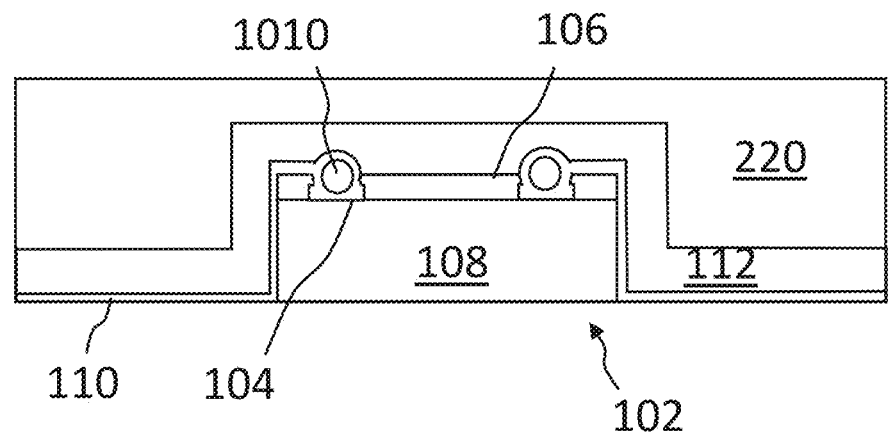
Figure 10B:
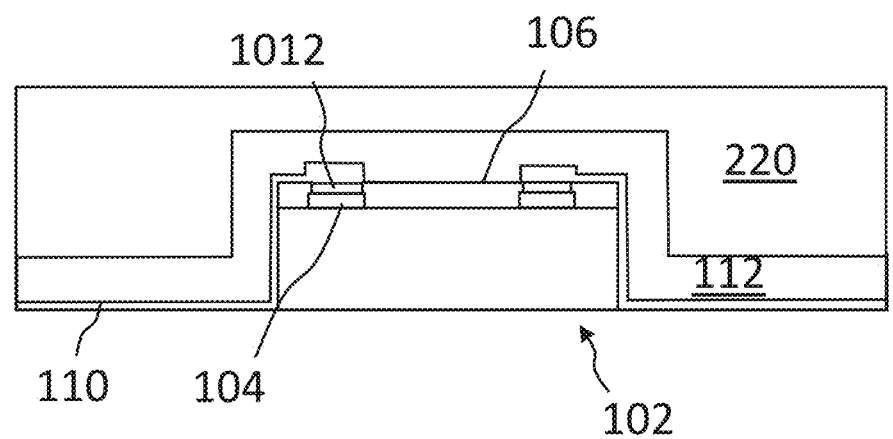
Figure 11:
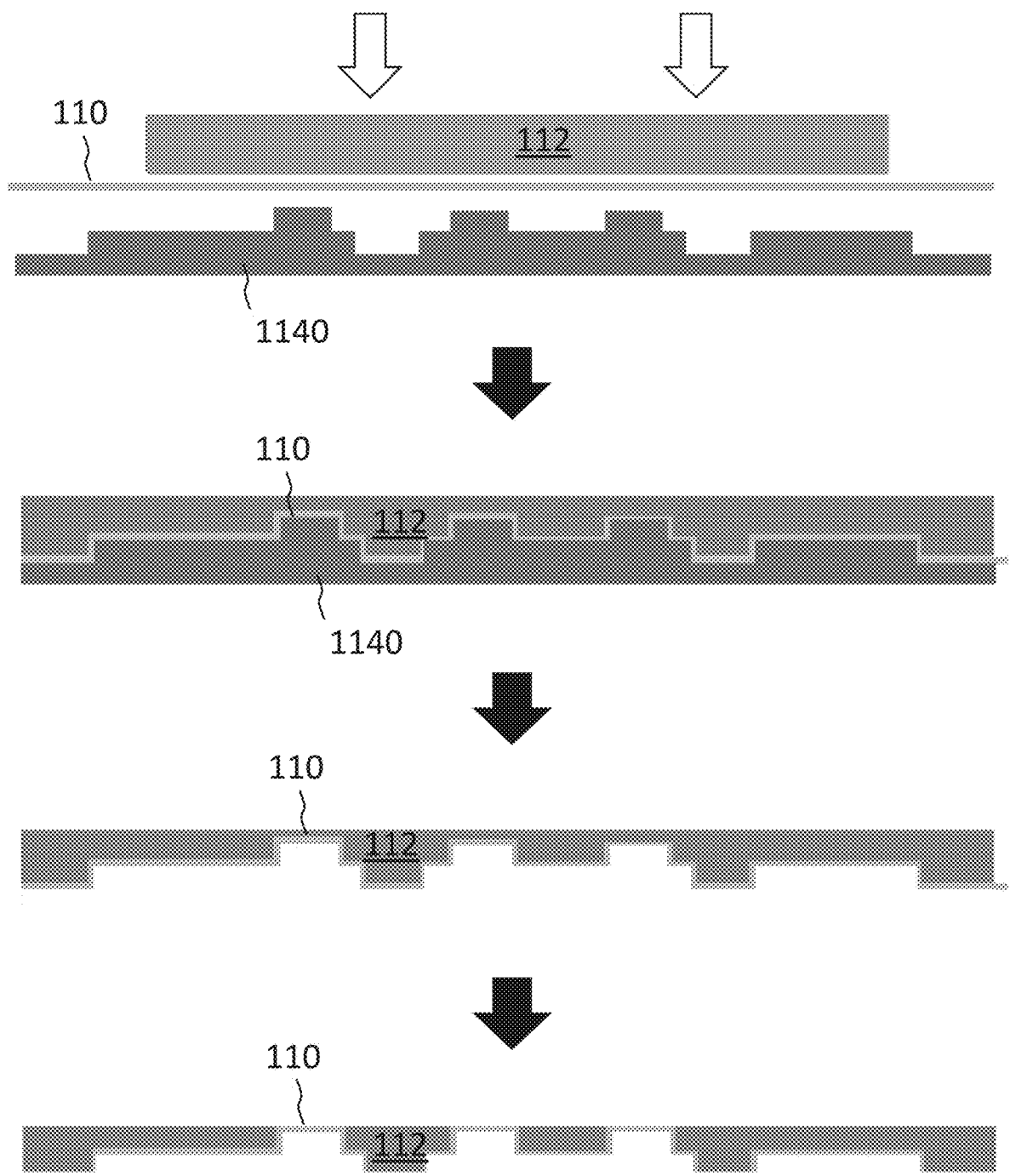

each of FIGS. 4 and 5 schematically illustrates a chip package in accordance with various embodiments;

FIG. 6 schematically illustrates a method of forming a chip package in accordance with various embodiments;

FIG. 7 schematically illustrates two methods of forming a chip package in accordance with various embodiments;

FIG. 8 schematically illustrates a detailed aspect of a method of forming a chip package in accordance with various embodiments;

each of FIGS. 9A and 9B schematically illustrates a method of forming a chip package in accordance with various embodiments;

each of FIGS. 10A and 10B schematically illustrates a chip package in accordance with various embodiments;

FIG. 11 illustrates a method of forming a contact structure for a chip. and

FIG. 12 shows a flow diagram of a method of forming a chip package in accordance with various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a deep drawing of a metalized dielectric (e.g. plastic) foil (the dielectric foil may also be referred to as "carrier") or of a copper foil may be used to form 3D interconnects.

The metallization may in various embodiments be pre structured. This may allow to provide a batch front side (FS) interconnect method including hetero-integration of logic- and power chips by providing interconnects having different metal thicknesses.

In various embodiments, a method of forming a semiconductor chip package is provided that uses a parallel/semi-parallel process instead of wire bonding. The process may be flexible enough to allow a variety of products and adaptions for process variations. Additionally, the precision may be improved by an optimized process sequence.

In various embodiments, the wiring of the package may be achieved by a combination of metal foils and a malleable (formable) dielectric material (the carrier), preferably a polymer material. The metal foil and/or the carrier may be structured to achieve a desired functionality and may afterwards be pressed over the chip. Thereby, the metal foil (and the carrier, if present) may be formed into a 3D-structure, forming the electrical interconnects as well as all required contacts. In other words, a redistribution layer may be formed. An additional molded encapsulation may in various embodiments be provided for mechanical stability and robustness.

In various embodiments, general principles of metal forming (deep-drawing) and connection (ultrasonic welding, soldering, conductive glue) may be combined to form electrical contacts and a connection layer for the chip.

Figure 1:
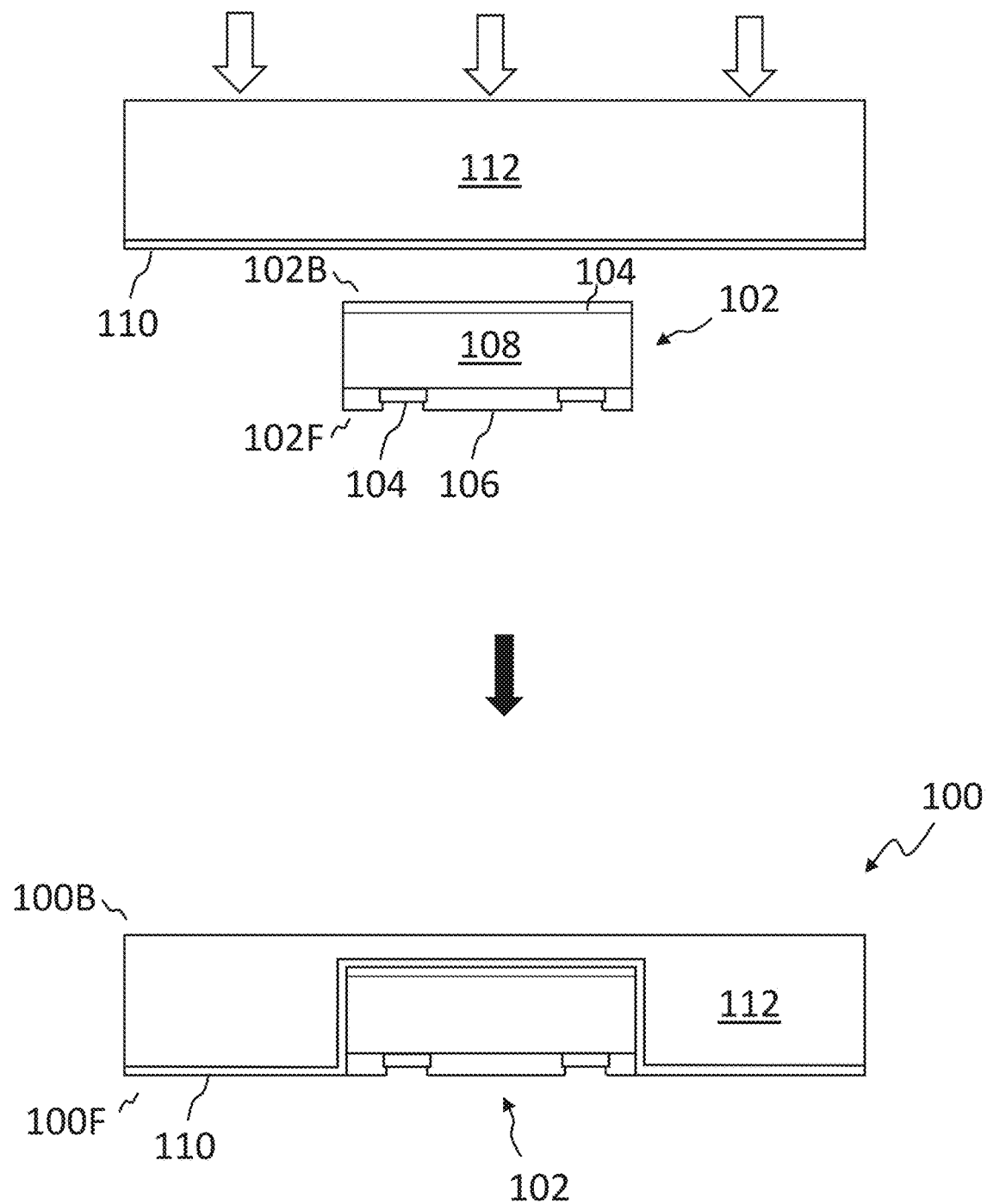
FIG. 1 schematically illustrates a method of forming a chip package in accordance with various embodiments.
Figure 2:
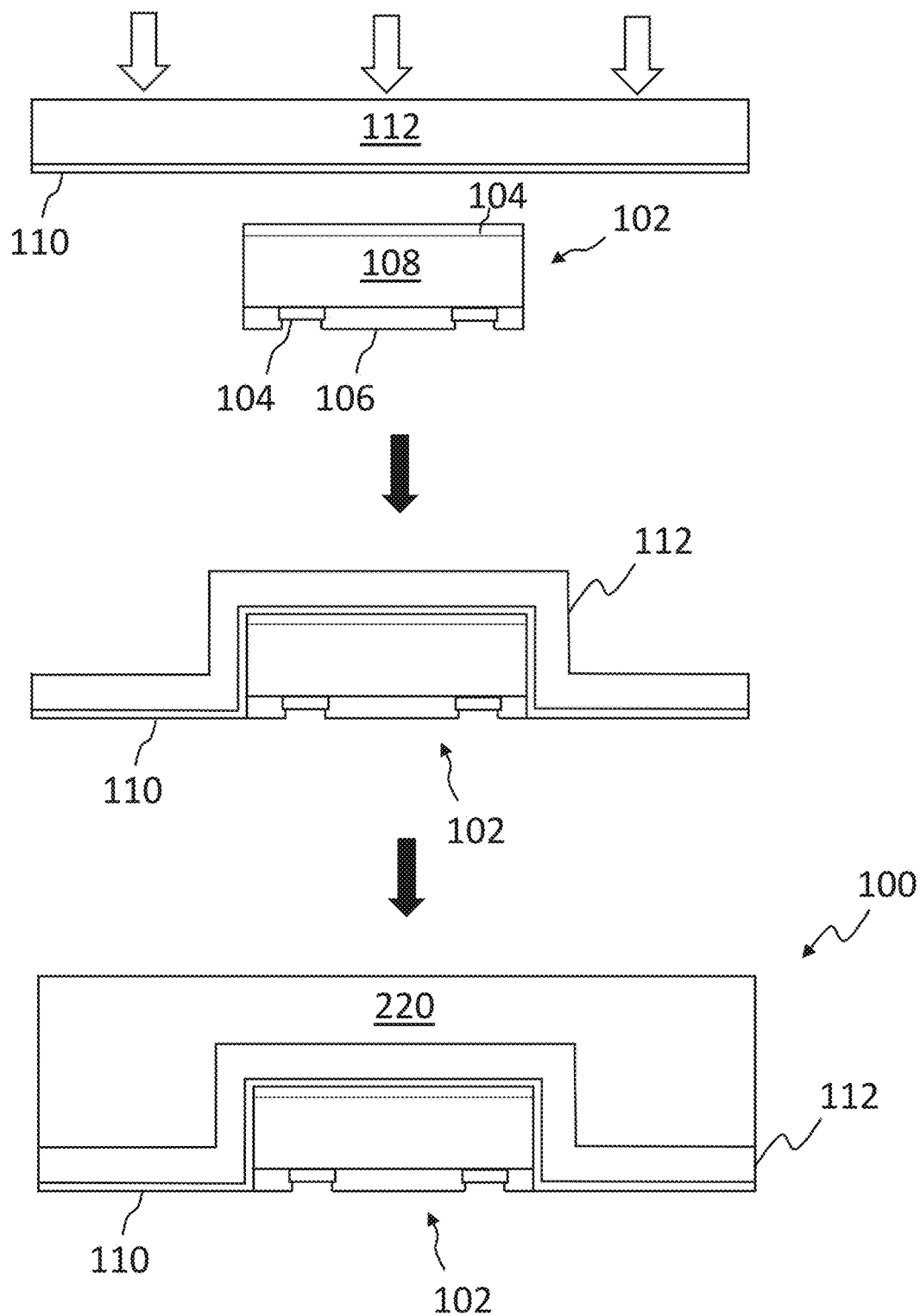
FIG. 2 schematically illustrates a method of forming a chip package in accordance with various embodiments.
Figure 3:
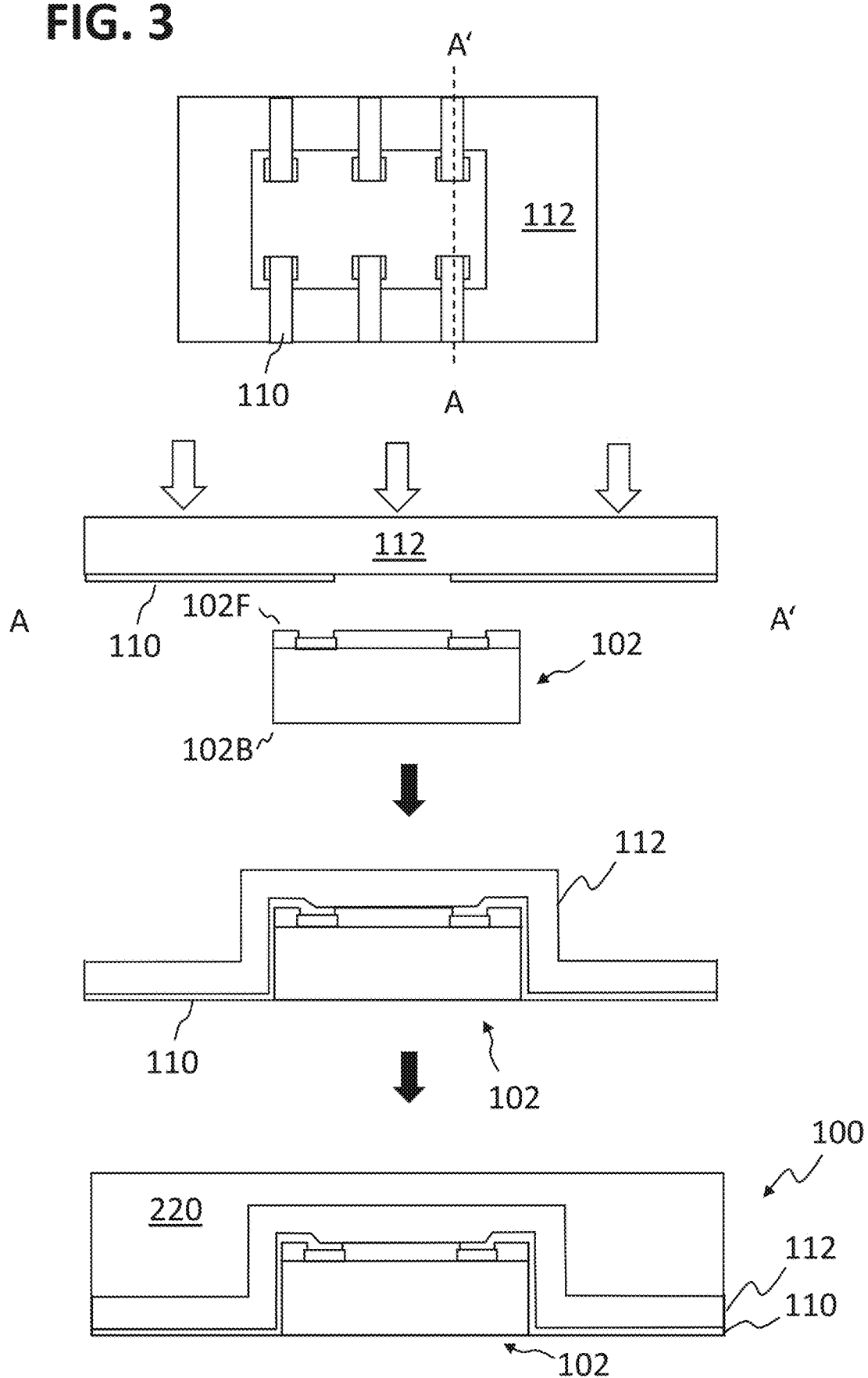
FIG. 3 schematically illustrates a method of forming a chip package in accordance with various embodiments.

Each of FIGS. 1 to 3, 6, 7, 9A, and 9B schematically illustrates, as sequences of two or more schematic cross-sectional views, a method of forming a chip package 100 in accordance with various embodiments. In FIGS. 3 and 6, a top view outlining all of the vertically stacked structures is additionally provided to enhance an understanding of where the cross section is located.

As shown in each of FIGS. 1 to 3, 6, 7, 9A, and 9B, a malleable carrier 112 with a layer of an electrically conductive material ("layer" for short) 110 formed thereon may be provided.

In various embodiments, the malleable carrier 112 (together with the layer 110) may be positively fitted to a chip 102 to at least partially enclose the chip 102 with the malleable carrier 112 (and the layer 110). The chip 102 may include a semiconductor substrate 108, and chip contacts 104. Around the chip contacts 104, a dielectric material 106 may be arranged. At least one of the chip contacts 104 may be arranged on a front side 102F of the chip 102. In various embodiments, another of the chip contacts 104 may be arranged on a back side 102B of the chip 102.

By the positive fitting process, it may be achieved that the layer 110 at least partially physically contacts the chip 102, such that the layer 110 electrically contacts at least one of the chip contacts 104 of the chip 102. The layer may form a redistribution layer.

At least one of the chip contacts 104 may in various embodiments be free from the (redistribution) layer 110 and may be referred to as a further chip contact 104. The further chip contact 104 and a portion of the layer 110 (which may form the redistributed contact) may be exposed at the same side.

The side of the package 100 where electrical contacts are exposed (redistributed chip contacts formed by portions of the layer 110 and, optionally, original chip contacts 104) may be referred to as a front side 100F of the chip package 100.

In the exemplary embodiment of FIGS. 1 and 2, the front side 102F chip contacts 104 are unconnected to the layer 110, and are exposed together with the redistributed backside chip contact 104 at the front side 100F of the chip package 100.

In the exemplary embodiments of FIGS. 1 and 2, only one redistributed chip contact is formed, namely the redistributed chip backside contact.

This embodiment may be fully capable of forming a DirectFET-like package. Since the chip sides may be on drain potential anyhow, an insulation between the layer 110 and the chip side surfaces may not be necessary. Nevertheless, an adhesion promoter 770 or an adhesive chip insulation layer 552 may be provided at the sides of the chip 102 in various embodiments (see for example FIG. 5 or FIG. 7).

In various embodiments, the layer 110 along the sides of the chip 102 may carry a different potential than the semiconductor substrate 108, which may have significant conductivity. A lack of insulation between the layer 110 and the semiconductor substrate 108 may in that case result in a short in the related contacts 104.

An additional chip side insulation layer 440, 552, which may optionally additionally act as an adhesion layer 552, may therefore be provided in various embodiments (see for example FIG. 4, FIG. 5 or FIG. 7).

The insulation layer 440, 552 or the adhesion promoter 770 may in various embodiments be provided on sides of the chip 102 before the deep drawing process.

In other words, instead of processing a bare semiconductor chip 102, a recon die like for fan-out wafer-level packaging (FoWLP) may be used. The chip 102 may thus be provided with the insulation layers 440, 552 on its side surfaces before being enclosed by the carrier/layer combination 112/110.

This means that the chip 102 may be provided with tough, insensitive side walls that may be well suited for being pressed. Furthermore, an insulating backside may be provided (the insulation layer 440 may enclose the chip 102 from all sides and from the backside 102B). This is shown in the exemplary embodiment of FIG. 4.

In various embodiments, the insulation layer 552 may be realized by the application of a dielectric layer 552 on the chip side surfaces, e.g. an oxide, a nitride, an imide, or an epoxy.

In various embodiments, the insulation layer 552, e.g. a polymer layer, may be applied on the carrier/layer-combination 112/110. An exemplary embodiment is shown in FIG. 6. Please note that in the top view, outlines of all the vertically stacked elements are shown. In other words, the view from the top is not meant to indicate that the layer 110 is formed above the insulation layer 552. That it is formed between the carrier 112 and the insulation layer 552 (in regions where the insulation layer 552 is formed) can be seen in the cross-sectional view in the second panel of FIG. 6.

In other words, on the layer 110, the insulation layer 552 may be pre-applied, as a structured layer 552, e.g. printed or pre-structured and attached. The insulation layer 552 may be configured to isolate a part of the layer 110 towards the chip 102, for example most of the layer 110. The insulation layer 552 may be or include the same material (e.g. polymer) as used as the carrier 112, or it may for example be an isolating adhesive layer, like e.g. Tesa HAF®.

The insulation layer 552 may in various embodiments not only be applied between the layer 110 and the chip 102, but also between the carrier 112 and the chip 102.

In various embodiments, the insulation layer 552 may provide an additional advantage by filling a gap between the chip side and the carrier 112 (or the layer 110, respectively) and seal it safely. Also an area of the carrier 112, which may contact the non-pad area on the chip frontside 102F, may be glued on in this way.

In various embodiments, in which an increased adhesion may be desired but an insulation may not be necessary, or in which the layer 110 is to be connected to the insulation layer 552 (e.g., a polymer layer), an adhesion promotion 770 (see FIG. 7) may be provided, for example a surface roughening. The adhesion promotion 770 may be applied to the layer 110 before the deep drawing.

In various embodiments, the backside chip contact 104 may be unconnected to the layer 110, or the chip 102 may not have a backside chip contact (like in the exemplary embodiment of FIG. 4).

Redistributed chip contacts 104 from the front side 102F of the chip 102 may be exposed at the front side 100F of the chip package 100, where the back side 102B of the chip 102 may be exposed (as shown in an exemplary fashion in FIGS. 3, 6, 9A, 9B, 10A, and 10B) or may be covered by an insulation (as shown in an exemplary fashion in FIGS. 4, 5, and 7).

In various embodiments, to address a multitude of different potentials (which may for example be required to contact the chip frontside 102F), the metal layer 110 may be a structured layer. This is indicated in particular in FIGS. 3, 6, and 8, where the schematic top views are provided, but may also be relevant for other embodiments.

In various embodiments, a carrier/layer-combination 112/110, e.g. a one layer flex, may be structured to form a multitude of contacts that on the one hand (at one end) fit on the chip contacts 104, and on the other hand (at the other end) form pads that form outer contacts of the package 100 after processing.

The carrier 112 with the structured layer 110 formed thereon may be pressed onto the frontside 102F of the chip 102 (the deep drawing is visualized by white arrows in the figures), thereby forming all electrical connections to the chip contacts 104 and (redistributed) pads at the same time. This is in particular visualized in FIGS. 3 and 6.

In various embodiments, to achieve a robust standard outline, an additional molding process may be applied as described in context with FIG. 2 and shown in, e.g., FIG. 3 and FIG. 6, respectively.

To achieve a high robustness of the chips 102, a thick passivation may be desirable. This may allow for an additional feature: By forming the chip contacts 104 with a shape that may allow (or require) locking the chip contacts 104 and the structured layer 110 (which may in this case be structured with a matching, i.e. complementary, structure, a self-aligning feature may be achieved. For example, jigsaw puzzle type complementary structures may be provided by the chip contact 104 (e.g., as a protrusion) and the layer 110 (e.g., as an opening). This is shown in FIG. 8 in an exemplary fashion. A higher robustness may be achieved thereby.

For forming the structured metal layer 110 on the carrier 112, it may be preferable to not use B-stage material like for example resin-coated copper (RCC), but to use a combination of a malleable polymer, e.g. polyimide, and metal, e.g. copper, for example so-called flex-boards.

In particular, the structured layer 110 may be present on the carrier 112 only in regions where a respective electrical contact to the chip contacts 104 is to be formed (a contact portion), where the deep-drawn layer 110 is to form the redistributed chip contact (a redistributed contact portion), and in a region connecting the contact portion and the redistributed contact portion. The layer 110 may be structured to form one or more redistributed chip contacts.

In each of the exemplary embodiments of FIGS. 3 and 6, six redistributed chip contact are formed, and the layer 110 on the carrier 112 of FIG. 8 is also configured to form six redistributed chip contacts. In each of the exemplary embodiments of FIGS. 4, 5, and 7, at least two redistributed chip contacts are formed.

In each of the exemplary embodiments of FIGS. 9A, 9B, 10A, and 10B, further features of which will be discussed below, at least four redistributed chip contacts are formed.

The layer 110 may be structured essentially as known in the art. Depending on a complexity of the structures to be formed and/or the materials of the carrier 112 and of the layer 110, this will usually be done by lithographic processing. Different surfaces may be formed according to the described embodiments, e.g. by galvanic or e-less plating. Additionally layers of connecting materials like adhesive (e.g. glue) and contact enhancement material, e.g. solder, may be applied by e.g. stencil printing, screen-printing, inkjet printing.

The further process, i.e. a preparation for the deep drawing process, may for example include applying, e.g. mounting, the chip 102 to the carrier/layer combination 112/110 for example by a temporary bonding or by a permanent connection, or by attaching the chip 102 to a temporary carrier (not shown).

In various embodiments, the electrically conductive material of the layer 110 may include or consist of at least one of a group of electrically conductive materials. The group may include copper, silver, aluminum, and an alloy of one or more of the above materials. A soft copper (galvanic or oxygen-free) may be preferred.

The dielectric carrier 112 may in various embodiments include a polymer, for example an imide, e.g. polyimide, a resin, e.g. a b-stage resin, or a high temperature capable thermoplastic polymer like polyphenylene sulfide (PPS). These materials may in various embodiments be filled to lower the CTE and improve package robustness. Thermally highly conductive fillers may be applied to improve thermal performance.

In various embodiments, it may be sufficient that the dielectric carrier 112 is malleable during the deep drawing process, which may occur at an elevated processing temperature. The dielectric carrier 112 may in various embodiments harden, at least to some degree, after the deep drawing.

In an exemplary embodiment, a copper-metallized plastic foil, e.g. polyimide foil, may be used.

The deep drawing may in various embodiments include hot pressing.

For the pressing, the chip 102 may be rested on a rather hard support surface. The cover-side may either be provided as having a dedicated form, which may conform to the topology of the output, or a soft stack-up may be provided to achieve a quasi-hydrostatic pressure and result in an almost conformal formation of carrier/layer combination 112/110 (the cover layer) over the chip 102. The method including the soft stack-up may have the advantage that forces applied to the chip (e.g., shear and tensile forces), which may be dangerous for the chip 102, may be minimized.

In various embodiments, the carrier 112, which may for example include a resin-coated copper or a similar material, may be thicker than the chip 102. For example, as shown in FIG. 1, a simple connection of the chip backside 102B to the frontside 102F (or the package frontside 100F, respectively) may be formed.

The chip 102 may be placed on the metal side of the carrier-layer-combination 112/110, i.e. on the layer 110.

Subsequently, the carrier 112 may be deep-drawn, e.g. hot pressed, around the chip 102. Thereby, the (metal) layer 110 may be deformed to form a complete cover of the chip backside 102B and the chip side surfaces, and to be flush with the chip front side 102F. The portions of the metal layer 110 that are flush with the chip front side 102F may form the redistributed chip contact. In other words, the metal areas that exceed the chip area may result in a solderable contact on the same level as the chip front side 102F. If this is already prepared in a way that is applicable for board soldering, the chip package 100 is ready. In various embodiments, further processes like separation, surface finishing etc. may be applied.

In various embodiments, the chip 102 may be thicker than the carrier 112 or thicker than the carrier-layer-combination (e.g., a metalized plastic foil). In that case, the deep drawing may result in a topology that reproduces at least partly the contours of the chip 102. Exemplary embodiments are shown in FIGS. 2 to 7 and 9A to 10B.

A package 100 with a standard appearance may be achieved by a subsequent molding process that may partially encapsulate the carrier 112 with a mold compound 220. Since the mold compound 220 may not be in direct contact with the chip 102, a relatively cheap quality may be used, thereby a further cost reduction may be achieved.

In the above described embodiments, packages 100 with an outline like a quad flat no leads package (VQFN) or dual small outline packages (DSO), either with exposed pads or without, have been realized, having in common that they have only one row of outline pads on one side and no possibility for package internal routing.

In various embodiments, exemplary embodiments of which are described in FIGS. 9A to 10B, at least one additional conductive layer 990 in addition to the conductive layer 110 may be provided.

The exemplary embodiments are described with two layers 110, 990. However, in principle the number of conductive layers may be unlimited, for example three, four, or more layers, which may be separated by the carrier 112 and further layers of dielectric material, which may be the same as the material of the carrier layer 112 or a different material.

In various embodiments, the additional layer 990 may be provided on a side of the carrier 112 that is opposite the layer 110. For example, a flex board with structured electrically conductive layers on both sides may be provided.

In various embodiments, the layer 110 may be configured to form all desired contacts to the chip 102, i.e. to the chip contacts 104, and to the package 100 outside (e.g. the portions of the layer 110 that are exposed on the front side 100F of the package 100 after the deep drawing). The additional layer 990 may be configured as a routing layer, which may lead contacts over the layer 110. A second row of exposed contacts around the chip 102 may be formed in this way.

A contact between the additional layer 990 and either the layer 110 or a front side 100F of the package 100 may be provided by vias 992 (see FIG. 9A) and/or by providing the carrier 112 as a structured carrier 112 with openings 994 through which the additional layer 990 may be exposed (see FIG. 9B). In a case of providing the insulating layer 552, matching openings 996 to the openings 994 may be provided for exposing the additional layer 990 to the front side 100F of the package 100.

In various embodiments, with this approach, land grid array or ball grid array packages can be built, realizing more than one row of pads around the package outline. Additionally, the additional layer(s) 990 may optionally be used for a complex routing of different potentials.

In various embodiments, the two layers 110, 990 for connection may also be used to achieve a hetero-integration with fine line space for logic and thick metal lines (e.g. copper lines) for power applications. A corresponding exemplary embodiment is shown in FIG. 9B, in which the additional layer 990 is thicker than the layer 110.

A second chip (not shown) may in various embodiments be integrated and connected with the chip 102. Thereby, a hetero-integration of e.g. logic and power chips 102 with different technology requirements in the same package technology may be provided.

In various embodiments, the layers 110, 990 may be of the same thickness before the deep drawing, and the outer layer(s) 990 may thereafter be thickened, for example by galvanic processes.

In various embodiments, for example if only the layer 110 is present, the layer 110 may have a thickness in a range from about 5 µm to about 250 µm.

In various embodiments, the layer 110 may have a thickness in a range from about 5 µm to about 50 µm, and the further layer(s) 990 may have a thickness in a range from about 50 µm to about 250 µm.

In various embodiments, the method of forming the chip package may allow to improve the connection of the chip 102 (e.g., the chip contacts 104) to the conductive layer 110. A reliable, robust and conductive interconnect may have to be formed.

For this, in various embodiments, two clean, sufficiently noble surfaces may be pressed together, preferably with a high deformation. To achieve this, an artificially tailored roughness and/or an application of activating plasma may in various embodiments be applied.

Alternatively or additionally, an additional connecting material may be applied, for example a solder material 1010, 1012.

In various embodiments, the chip 102 may be soldered to the metal layer 110 before the deep drawing process (the pressing and optionally heating). The soldering may be achieved by printed solder or by solder balls 1010 (or by copper/nickel core balls). A corresponding exemplary embodiment is shown in FIG. 10.

In various embodiments, a solder reservoir may be applied before the deep drawing process (the pressing and optionally heating), and the soldering process may be combined with the pressing process. A corresponding exemplary embodiment is shown in FIG. 11. A thin solder layer 1012 may result in a fully reacted phase, i.e. a diffusion solder.

As an alternative to the soldering, for example gluing (highly conductive or anisotropic conductive) or sintering may be used.

In various embodiments, an exemplary embodiment of which is visualized in the process shown in FIG. 11, the metal layer 110 may not be mounted to the carrier 112 during the deep drawing process.

Instead, the metal layer 110 may be conformed to a pre-shaped mold 1140 during a molding process, in which the malleable (optionally liquid) carrier material 112 may be pressed towards the metal layer 110 for pressing the metal layer 110 towards the pre-shaped mold 1140.

The carrier material 112 may be configured to harden after the deep-drawing process, to serve as a stabilizing carrier 112 for the metal layer 110.

Further processing may include grinding, on one side or on both sides of the carrier/layer combination 112/110. The pre-shaped mold 1140 may be removed after the grinding of the top side, or before the grinding of the bottom side, respectively.

In various embodiments, the resulting carrier/layer combination 112/110, which may serve as a contact structure, may include tracks and trough-contacts.

FIG. 12 shows a flow diagram 1200 of a method of forming a chip package in accordance with various embodiments.

The method may include providing a malleable carrier with a layer of an electrically conductive material formed thereon (1210), and positive fitting the malleable carrier to a chip to at least partially enclose the chip with the malleable carrier, wherein the layer at least partially physically contacts the chip, such that the layer electrically contacts a chip contact of the chip, and wherein the layer forms a redistribution layer (1220).

Various examples will be illustrated in the following:

Example 1 is a method of forming a chip package. The method may include providing a malleable carrier with a layer of an electrically conductive material formed thereon, and positive fitting the malleable carrier to a chip to at least partially enclose the chip with the malleable carrier, wherein the layer at least partially physically contacts the chip, such that the layer electrically contacts a chip contact of the chip, and wherein the layer forms a redistribution layer.

In Example 2, the subject-matter of Example 1 may optionally include that the chip includes a further chip contact, and that the further chip contact and a portion of the layer are exposed at the same side of the chip package.

In Example 3, the subject-matter of Example 1 or 2 may optionally include that the layer is a structured layer.

In Example 4, the subject-matter of any of Examples 1 to 3 may optionally include that the electrically conductive material includes at least one of a group of electrically conductive materials, the group including copper, silver, aluminum, and an alloy of one or more of the above materials.

In Example 5, the subject-matter of any of Examples 1 to 4 may optionally include that the electrically conductive material is coated with a further electrically conductive material including at least one of a group of electrically conductive materials, the group including tin, zinc, nickel, silver, palladium, and gold.

In Example 6, the subject-matter of any of Examples 1 to 5 may optionally further include arranging insulating material along side walls of the chip, wherein the insulating material optionally completely covers the side walls of the chip.

In Example 7, the subject-matter of Example 6 may optionally include that the insulating material is arranged along the side walls of the chip before the positive fitting of the malleable carrier to the chip.

In Example 8, the subject-matter of Example 6 may optionally include that the arranging the insulating material along side walls of the chip includes arranging the insulating material in a predefined area on the carrier over the layer of electrically conductive material before the positive fitting of the malleable carrier to the chip.

In Example 9, the subject-matter of any of Examples 1 to 8 may optionally further include arranging an encapsulation material on the malleable carrier after the positive fitting of the malleable carrier to the chip.

In Example 10, the subject-matter of any of Examples 1 to 9 may optionally further include that the chip contact of the chip forms a protrusion with a predefined shape, and that the layer includes an opening having a predefined shape matching the protrusion.

In Example 6, the subject-matter of any of Examples 1 to 5 may optionally further include an adhesive material on the carrier before the positive fitting of the malleable carrier to the chip.

In Example 12, the subject-matter of Example 11 may optionally include that the adhesive material is arranged over and/or under the layer of electrically conductive material.

In Example 13, the subject-matter of Example 11 or 12 may optionally include that the arranging the adhesive material includes printing, for example stencil printing, screen-printing, inkjet printing, and/or spraying.

In Example 14, the subject-matter of any of Examples 1 to 13 may optionally include that the layer has a thickness in a range from 5 µm to 250 µm.

In Example 15, the subject-matter of any of Examples 1 to 14 may optionally further include forming a further layer of an electrically conductive material on the carrier on a side of the carrier that is opposite the layer.

In Example 16, the subject-matter of Example 15 may optionally include forming at least one contact extending through the carrier electrically conductively connecting the layer and the further layer.

In Example 17, the subject-matter of Example 15 or 16 may optionally include that the layer is thicker than the further layer, or vice versa.

In Example 18, the subject-matter of Example 17 may optionally include that the forming of the thicker layer includes forming a base layer, which optionally has the same thickness as the thinner layer, and galvanizing the base layer with further electrically conductive material, thereby increasing the thickness of the base layer to form the thicker layer.

In Example 19, the subject-matter of any of Examples 15 to 18 may optionally include that the layer has a thickness of between 5 µm and 50 µm, and the further layer has a thickness of between more than 50 µm and 250 µm, or vice versa.

In Example 20, the subject-matter of any of Examples 1 to 19 may optionally further include arranging connection material in at least one predefined area on the layer.

In Example 21, the subject-matter of Example 20 may optionally include that the connection material includes at least one of a group of connection materials including solder, electrically conductive glue, and an electrically conductive sinter material.

Example 22 is a chip package. The chip package may include a chip including at least one chip contact, and a malleable carrier with a layer of an electrically conductive material formed thereon fitted to the chip and partially enclosing the chip, wherein the layer at least partially physically contacts the chip, such that the layer electrically contacts a chip contact of the chip, and wherein the layer forms a redistribution layer.

In Example 23, the subject-matter of Example 22 may optionally include that the chip includes a further chip contact, and that the further chip contact and a portion of the layer are exposed at the same side of the chip package.

In Example 24, the subject-matter of Example 22 or 23 may optionally include that the layer is a structured layer.

In Example 25, the subject-matter of any of Examples 22 to 24 may optionally include that the electrically conductive material includes at least one of a group of electrically conductive materials, the group including copper, silver, aluminum, and an alloy of one or more of the above materials.

In Example 26, the subject-matter of any of Examples 22 to 25 may optionally include that the electrically conductive material is coated with a further electrically conductive material including at least one of a group of electrically conductive materials, the group including tin, zinc, nickel, silver, palladium, and gold.

In Example 27, the subject-matter of any of Examples 22 to 26 may optionally further include insulating material arranged along side walls of the chip, wherein the insulating material optionally completely covers the side walls of the chip.

In Example 28, the subject-matter of any of Examples 22 to 27 may optionally further include encapsulation material arranged over the malleable carrier.

In Example 29, the subject-matter of any of Examples 22 to 28 may optionally further include that the chip contact of the chip forms a protrusion with a predefined shape, and that the layer includes an opening having a predefined shape matching the protrusion.

In Example 30, the subject-matter of any of Examples 22 to 29 may optionally further include an adhesive material arranged between the carrier and the chip.

In Example 31, the subject-matter of Example 30 may optionally include that the adhesive material is arranged over and/or under the layer of electrically conductive material.

In Example 32, the subject-matter of any of Examples 22 to 31 may optionally further include that the layer has a thickness in a range from 5 µm to 250 µm.

In Example 33, the subject-matter of any of Examples 22 to 32 may optionally further include a further layer of an electrically conductive material on the carrier on a side of the carrier that is opposite the layer.

In Example 34, the subject-matter of Example 33 may optionally further include at least one contact extending through the carrier electrically conductively connecting the layer and the further layer.

In Example 35, the subject-matter of Example 33 or 34 may optionally include that the layer is thicker than the further layer, or vice versa.

In Example 36, the subject-matter of any of Examples 33 to 35 may optionally include that the layer has a thickness of between 5 µm and 50 µm, and the further layer has a thickness of between more than 50 µm and 250 µm, or vice versa.

In Example 37, the subject-matter of any of Examples 22 to 36 may optionally further include connection material in at least one predefined area between the layer and the chip.

In Example 38, the subject-matter of Example 37 may optionally include that the connection material includes at least one of a group of connection materials including solder, electrically conductive glue, and an electrically conductive sinter material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a chip package, the method comprising:
    providing a malleable carrier with a layer of an electrically conductive material formed thereon; and
    positive fitting the malleable carrier to a chip to at least partially enclose the chip with the malleable carrier such that the malleable carrier conforms to outer edge sides of the chip,
    wherein the layer at least partially physically contacts the chip, such that the layer electrically contacts a chip contact of the chip,
    wherein the layer forms a redistribution layer.
2. The method of claim 1,
    wherein the chip comprises a further chip contact, and
    wherein the further chip contact and a portion of the layer are exposed at the same side of the chip package.
3. The method of claim 1,
    wherein the layer is a structured layer.
4. The method of claim 1,
    wherein the electrically conductive material comprises at least one electrically conductive material selected from the group consisting of:
    copper;
    silver;
    aluminum; and
    an alloy of one or more of copper, silver and aluminum.
5. The method of claim 1, further comprising:
    arranging insulating material along side walls of the chip.
6. The method of claim 5,
    wherein the insulating material is arranged along the side walls of the chip before the positive fitting of the malleable carrier to the chip.
7. The method of claim 5,
    wherein arranging the insulating material along side walls of the chip comprises:
    arranging the insulating material in a predefined area on the carrier over the layer of electrically conductive material before the positive fitting of the malleable carrier to the chip.
8. The method of claim 1, further comprising:
    arranging an encapsulation material on the malleable carrier after the positive fitting of the malleable carrier to the chip.
9. The method of claim 1,
    wherein the chip contact of the chip forms a protrusion with a predefined shape, and
    wherein the layer comprises an opening having a predefined shape matching the protrusion.
10. The method of claim 1, further comprising:
    arranging an adhesive material on the carrier before the positive fitting of the malleable carrier to the chip.
11. The method of claim 10,
    wherein the arranging the adhesive material comprises printing and/or spraying.
12. The method of claim 1,
    wherein the layer has a thickness in a range from 5 µm to 250 µm.
13. The method of claim 1, further comprising:
    forming a further layer of an electrically conductive material on the carrier on a side of the carrier that is opposite the layer.
14. The method of claim 13, further comprising:
    forming at least one contact extending through the carrier electrically conductively connecting the layer and the further layer.
15. The method of claim 13,
    wherein the layer is thicker than the further layer or the further layer is thicker than the layer.
16. The method of claim 15,
    wherein the forming of the thicker layer comprises forming a base layer and galvanizing the base layer with further electrically conductive material.
17. The method of claim 13,
    wherein the layer has a thickness of between 5 µm and 50 µm and the further layer has a thickness of between more than 50 µm and 250 µm, or wherein the further layer has a thickness of between 5 µm and 50 µm and the layer has a thickness of between more than 50 µm and 250 µm.
18. The method of claim 1, further comprising:
    arranging connection material in at least one predefined area on the layer.
19. The method of claim 18,
    wherein the connection material comprises at least one material selected from the group consisting of:
    solder;
    electrically conductive glue; and
    an electrically conductive sinter material.
20. A chip package, comprising:
    a chip comprising at least one chip contact; and a malleable carrier with a layer of an electrically conductive material formed thereon fitted to the chip and partially enclosing the chip such that the malleable carrier conforms to outer edge sides of the chip, wherein the layer at least partially physically contacts the chip, such that the layer electrically contacts a chip contact of the chip, wherein the layer forms a redistribution layer.

21. A method of forming a chip package, the method comprising:

providing a malleable carrier with a layer of an electrically conductive material formed thereon; and positive fitting the malleable carrier to a chip to at least partially enclose the chip with the malleable carrier, wherein the layer at least partially physically contacts the chip, such that the layer electrically contacts a chip contact of the chip, wherein the layer forms a redistribution layer, wherein the chip contact of the chip forms a protrusion with a predefined shape, and wherein the layer comprises an opening having a predefined shape matching the protrusion.

22. A method of forming a chip package, the method comprising:

providing a malleable carrier with a layer of an electrically conductive material formed thereon; and positive fitting the malleable carrier to a chip to at least partially enclose the chip with the malleable carrier, wherein the layer at least partially physically contacts the chip, such that the layer electrically contacts a chip contact of the chip, wherein the layer forms a redistribution layer, and wherein an insulating material is arranged along side walls of the chip before the positive fitting of the malleable carrier to the chip.

* * * * *